(12) United States Patent
Chen et al.

(10) Patent No.: US 12,133,446 B2
(45) Date of Patent: Oct. 29, 2024

(54) OLED DISPLAY PANEL, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wei Chen, Wuhan (CN); Ying Zheng, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 1074 days.

(21) Appl. No.: 16/965,295

(22) PCT Filed: Jun. 12, 2020

(86) PCT No.: PCT/CN2020/095747
§ 371 (c)(1),
(2) Date: Jul. 27, 2020

(87) PCT Pub. No.: WO2021/217799
PCT Pub. Date: Nov. 4, 2021

(65) Prior Publication Data
US 2023/0165114 A1   May 25, 2023

(30) Foreign Application Priority Data
Apr. 27, 2020  (CN) .......................... 202010345978.7

(51) Int. Cl.
*H10K 59/80* (2023.01)
*H10K 59/50* (2023.01)
(Continued)

(52) U.S. Cl.
CPC .......... *H10K 59/873* (2023.02); *H10K 59/50* (2023.02); *H10K 59/80517* (2023.02);
(Continued)

(58) Field of Classification Search
None
See application file for complete search history.

(56) References Cited

U.S. PATENT DOCUMENTS 11,947,212 B2 * 4/2024 Wu .................. G02F 1/133603
2007/0085968 A1   4/2007 Hsu et al.
(Continued)

FOREIGN PATENT DOCUMENTS

CN    103048842 A      4/2013
CN    104122615 A  *  10/2014
(Continued)

OTHER PUBLICATIONS

International Search Report in International application No. PCT/CN2020/095747, mailed on Nov. 4, 2021.
(Continued)

*Primary Examiner* — Ali Naraghi
*Assistant Examiner* — E. Rhett Cheek
(74) *Attorney, Agent, or Firm* — PV IP PC; Wie Te Chung

(57) ABSTRACT

An organic light-emitting diode (OLED) display panel, a manufacturing method thereof, and a display device are provided. The OLED display panel includes a substrate; an array functional layer; a light-emitting layer; a thin-film encapsulation layer; and a liquid crystal layer, which is disposed on the thin-film encapsulation layer, including a first liquid crystal region arranged on a non-pixel region and a second liquid crystal region arranged on a pixel region, wherein liquid crystal molecules positioned in the first liquid crystal region are aligned parallel to the substrate.

12 Claims, 3 Drawing Sheets

(51) Int. Cl.
*H10K 71/13* (2023.01)
*H10K 102/10* (2023.01)

(52) U.S. Cl.
CPC ..... *H10K 71/135* (2023.02); *H10K 2102/102* (2023.02); *H10K 2102/103* (2023.02)

(56) References Cited

U.S. PATENT DOCUMENTS

| | | | | |
|---|---|---|---|---|
| 2010/0091224 | A1* | 4/2010 | Cho | G02B 5/201 |
| | | | | 359/589 |
| 2012/0099047 | A1* | 4/2012 | Lee | G02F 1/1323 |
| | | | | 349/61 |
| 2015/0169094 | A1* | 6/2015 | Liu | H10K 59/8791 |
| | | | | 345/173 |
| 2016/0256892 | A1* | 9/2016 | Cheng | H10K 71/135 |
| 2018/0062090 | A1* | 3/2018 | Kim | H10K 59/131 |
| 2018/0124384 | A1* | 5/2018 | Huh | G02F 1/29 |
| 2018/0129113 | A1* | 5/2018 | Wang | H10K 59/8791 |
| 2019/0115547 | A1* | 4/2019 | Lee | B32B 27/365 |
| 2019/0355928 | A1* | 11/2019 | Narutaki | G02F 1/133553 |
| 2020/0292874 | A1* | 9/2020 | Ohashi | G02F 1/133512 |
| 2023/0046964 | A1* | 2/2023 | Mizusaki | G02F 1/133726 |

FOREIGN PATENT DOCUMENTS

| | | | |
|---|---|---|---|
| CN | 105762173 | A * | 7/2016 |
| CN | 107340662 | A * | 11/2017 |
| CN | 110161738 | A | 8/2019 |
| JP | 2013228706 | A * | 11/2013 |
| WO | 2016052922 | A1 | 4/2016 |

OTHER PUBLICATIONS

Written Opinion of the International Search Authority in International application No. PCT/CN2020/095747, mailed on Nov. 4, 2021.
Chinese Office Action issued in corresponding Chinese Patent Application No. 202010345978.7 dated Feb. 23, 2022, pp. 1-8.
Chinese Office Action issued in corresponding Chinese Patent Application No. 202010345978.7 dated May 17, 2022, pp. 1-8.

* cited by examiner

OLED DISPLAY PANEL, MANUFACTURING METHOD THEREOF, AND DISPLAY DEVICE

RELATED APPLICATIONS

This application is a Notional Phase of PCT Patent Application No. PCT/CN2020/095747 having international filing date of Jun. 12, 2020, which claims the benefit of priority of Chinese Patent Application No. 202010345978.7 filed on Apr. 27, 2020. The contents of the above applications are all incorporated by reference as if fully set forth herein in their entirety.

FIELD OF INVENTION

The present application relates to the field of display technologies, and in particular to an OLED display panel, a manufacturing method thereof, and a display device.

BACKGROUND OF INVENTION

In recent years, organic light-emitting diode (OLED) display panels have received more and more attention due to their excellent performance. They have high display quality, light weight, bendability, and can be made into foldable screens and rollable screens. Because the display panels consist of many film layers, bending resistance of some films is limited. Continuous mechanical bending will reduce a performance of the display panels. At present, there is still a certain degree of difficulty in fully realizing folding and rolling of the display panels.

In conventional manufacturing technology, an OLED display panel is usually attached with a circular polarizer in a final module stage, which is used to eliminate poor contrast of a device caused by external light reflected by metal wires inside the device. However, the polarizer has light absorption characteristic, and up to 55% of the light emitted by OLEDs will be absorbed by the polarizer, resulting in a reduction in brightness of the device and a shortened service life of the device. Meanwhile, the polarizer is often thicker, with a thickness of up to 100 microns, which is very unfavorable for bending of the device and is a major problem in the manufacturing of flexible display panels.

SUMMARY OF INVENTION

Technical Problem

The present application provides an organic light-emitting diode (OLED) display panel, a manufacturing method thereof, and a display device. The OLED display panel can effectively prevent a problem of reduced brightness and bending performance of the display panel due to an arrangement of a polarizer.

Technical Solution

In order to solve the above problem, in a first aspect, the present invention provides an OLED display panel, the OLED display panel includes:
  a substrate;
  an array functional layer disposed on the substrate;
  an organic light-emitting layer disposed on the array functional layer;
  a thin-film encapsulation layer disposed on the organic light-emitting layer; and
  a liquid crystal layer disposed on the thin-film encapsulation layer and including a first liquid crystal region arranged on a non-pixel region and a second liquid crystal region arranged on a pixel region, wherein liquid crystal molecules positioned in the first liquid crystal region are aligned parallel to the substrate.

In the OLED display panel according to an embodiment of the present invention, the OLED display panel further including a liquid crystal alignment layer disposed between the first liquid crystal region and the thin-film encapsulation layer to make the liquid crystal molecules positioned in the first liquid crystal region aligned parallel to the substrate.

In the OLED display panel according to an embodiment of the present invention, the liquid crystal alignment layer includes a polymer material having a photoreactive group.

In the OLED display panel according to an embodiment of the present invention, the polymer material having a photoreactive group includes azo compounds.

In the OLED display panel according to an embodiment of the present invention, material of the substrate includes polyimide.

In the OLED display panel according to an embodiment of the present invention, a thickness of the substrate ranges from 6 microns to 20 microns.

In the OLED display panel according to an embodiment of the present invention, the array functional layer includes a plurality of low-temperature polysilicon thin film transistors arranged in an array.

In the OLED display panel according to an embodiment of the present invention, the organic light-emitting layer includes an anode, a light-emitting functional layer, and a cathode.

In the OLED display panel according to an embodiment of the present invention, the anode is a stacked film layer of indium tin oxide/silver/indium tin oxide.

In the OLED display panel according to an embodiment of the present invention, further including a touch layer and a cover plate arranged on the liquid crystal layer.

In another aspect, the present invention provides a method of manufacturing an organic light-emitting diode (OLED) display panel, including following steps:
  S01: providing a substrate and forming an array functional layer on the substrate;
  S02: forming an organic light-emitting layer on the array functional layer;
  S03: forming a thin-film encapsulation layer on the organic light-emitting layer;
  S04: forming a liquid crystal alignment layer on the thin-film encapsulation layer corresponding to a non-pixel region;
  S05: forming a liquid crystal layer on the liquid crystal alignment layer corresponding to the non-pixel region and on a pixel region; and
  S06: providing a mask plate and irradiating toward the non-pixel region of the liquid crystal layer by ultraviolet light under cover of the mask plate to make liquid crystal molecules positioned on the non-pixel region aligned parallel to the substrate.

In the method of manufacturing the OLED display panel according to an embodiment of the present invention, in the step S04, forming the liquid crystal alignment layer includes using an inkjet printing process.

In the method of manufacturing the OLED display panel according to an embodiment of the present invention, the liquid crystal alignment layer includes a polymer material having a photoreactive group.

In the method of manufacturing the OLED display panel according to an embodiment of the present invention, the polymer material having a photoreactive group includes azo compounds.

In the method of manufacturing the OLED display panel according to an embodiment of the present invention, in the step S06, after ultraviolet light is applied to the non-pixel region of the liquid crystal layer, a polymer material in the liquid crystal alignment layer transfers from a through state to a normal state to make the liquid crystal molecules of the liquid crystal layer positioned in the non-pixel region aligned parallel to the substrate.

In the method of manufacturing the OLED display panel according to an embodiment of the present invention, in the step S06, a wavelength of the ultraviolet light is 365 nm.

In another aspect, the present invention further provides a display device, the display device including the organic light-emitting diode (OLED) display panel as described above.

In the display device according to an embodiment of the present invention, the display device is selected from one of a mobile phone, a tablet computer, a computer, a television, a car display, or a smart watch.

Beneficial Effect

Compared with the conventional art, the present invention provides an OLED display panel, a manufacturing method thereof, and a display device. In the provided OLED display panel, a liquid crystal layer is added on the thin-film encapsulation layer, including a configuration of a first liquid crystal region arranged on a non-pixel region, wherein the liquid crystal molecules positioned in the first liquid crystal region are aligned parallel to the substrate, so that the non-pixel region cannot transmit light; and a configuration of a second liquid crystal region arranged on a pixel region, wherein the liquid crystal molecules positioned in the second liquid crystal region are aligned perpendicular to the substrate, so that the pixel region is normally transparent. That is, the liquid crystal layer can be used to replace a circular polarizer provided in the conventional OLED display panel. On the one hand, it can effectively prevent problems of reduced brightness of the display panel and poor flexibility caused by the presence of the circular polarizer. On the other hand, a manufacturing process of the liquid crystal layer is simple, the cost is low, and mass production is easy to achieve.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
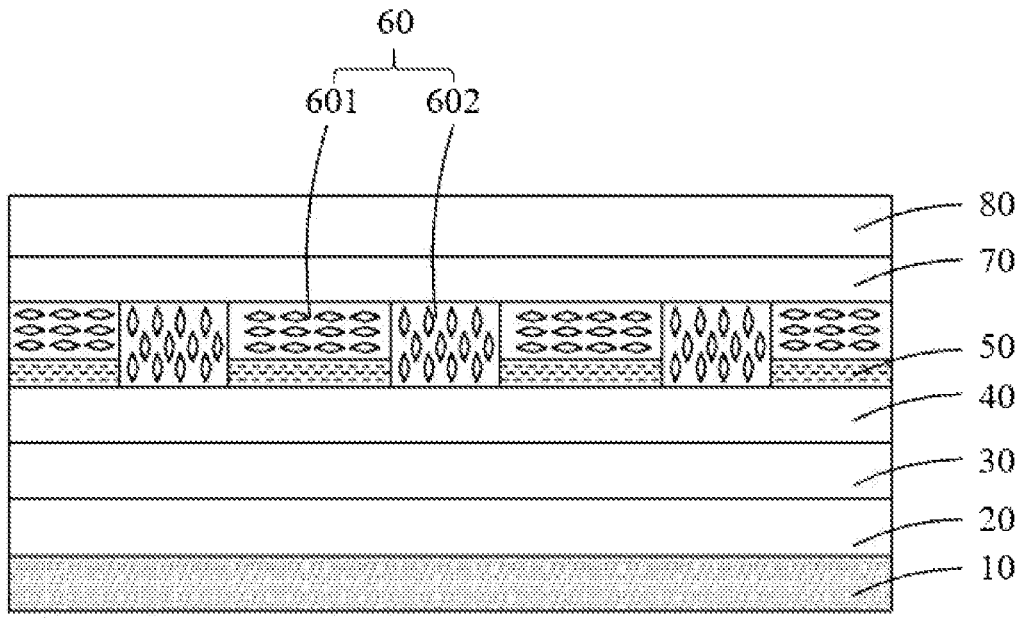
FIG. 1 is a schematic cross-sectional structure diagram of an organic light-emitting diode (OLED) display panel provided by an embodiment of the present invention.
Figure 2:
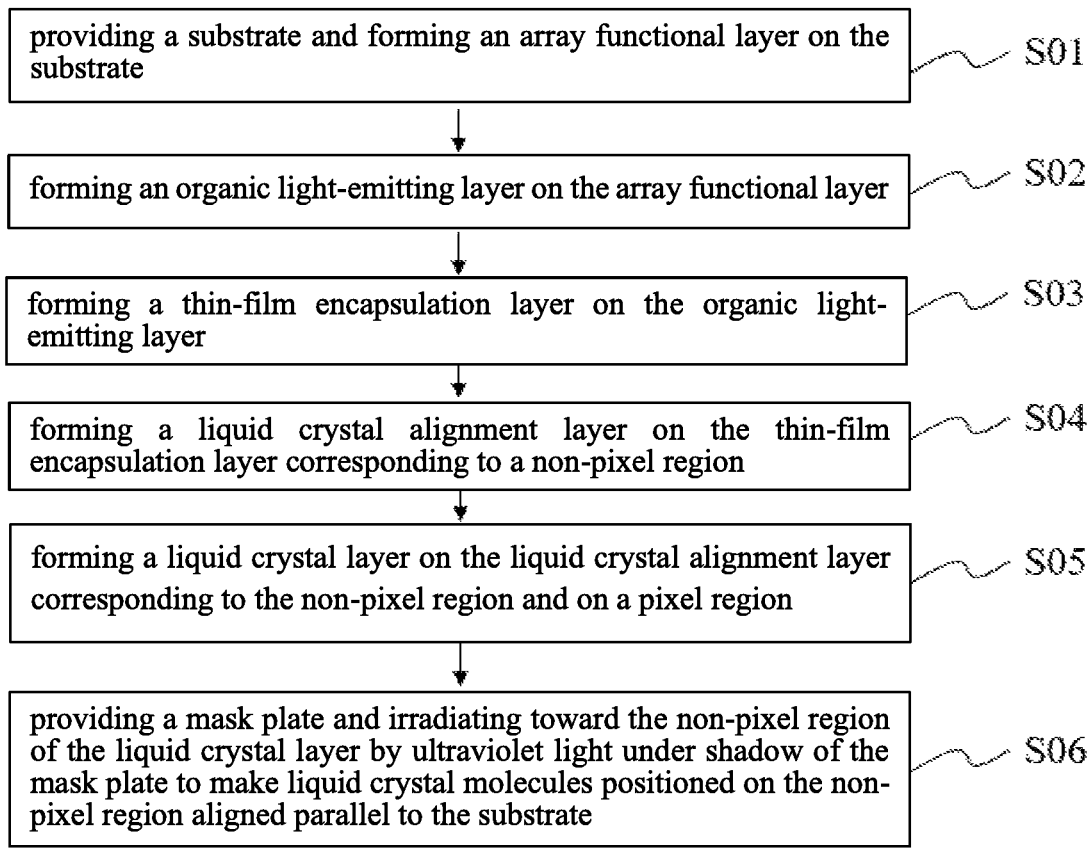
FIG. 2 is a schematic flowchart of a method of manufacturing the OLED display panel provided by an embodiment of the present invention.

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the present application, the term "exemplary" is used to mean "used as an example, illustration, or illustration." Any embodiment described in the present application as "exemplary" is not necessarily to be construed as being more preferred or advantageous than other embodiments. In order to enable any person skilled in the art to implement and use the present invention, the following description is given. In the following description, details are listed for explanatory purposes. It should be understood that those of ordinary skill in the art may recognize that the present invention can be implemented without using these specific details. In other instances, well-known structures and procedures will not be elaborated in detail in order to avoid unnecessary details that obscure the description of the present invention. Therefore, the present invention is not intended to be limited to the illustrated embodiments, but is consistent with the widest scope consistent with the principles and features disclosed in the present application.

An embodiment of the present invention provides an organic light-emitting diode (OLED) display panel. For a cross-sectional structure, please refer to FIG. 1, which will be described in detail below.

The OLED display panel includes following.

A substrate 10, wherein the substrate 10 is a flexible substrate and generally made of polyimide or other materials, a thickness of the substrate generally ranges from 6 microns to 20 microns, and the substrate can be made of a single-layer polyimide or double-layer polyimide film structure.

An array functional layer 20 is disposed on the substrate 10, and generally includes a plurality of low-temperature polysilicon thin film transistors arranged in an array.

An organic light-emitting layer 30 is disposed on the array functional layer 20, and generally includes an anode, a light-emitting functional layer, and a cathode. The anode can generally use a stacked film of indium tin oxide (ITO)/Ag/ITO or other metals.

A thin-film encapsulation layer 40 is disposed on the organic light-emitting layer 30, and an encapsulation structure of the thin-film encapsulation layer 40 generally adopts a stacked structure of an inorganic layer/organic layer/inorganic layer.

A liquid crystal layer 60 is disposed on the thin-film encapsulation layer 40, and includes a first liquid crystal region 601 arranged on a non-pixel region, and a second liquid crystal region 602 arranged on a pixel region. Liquid crystal molecules positioned in the first liquid crystal region 601 are aligned parallel to the substrate 10, that is, the light in the non-pixel region is prevented from entering, and the light reflected by metal lines in the non-pixel region is prevented. Liquid crystal molecules positioned in the second liquid crystal region 602 are aligned perpendicular to the substrate 10, that is, the light emitted by pixels in the pixel region is smoothly emitted. It can be understood that the liquid crystal molecules positioned in the second liquid crystal region 602 can always be aligned perpendicular to the substrate 10, or can be aligned perpendicular to the substrate 10 under an action of an electric field only during display.

The above-mentioned liquid crystal layer can replace a circular polarizer on a traditional OLED display panel. On the one hand, it can effectively prevent problems of reduced brightness of the display panel and poor flexibility due to the presence of the circular polarizer. On the other hand, a manufacturing process of the liquid crystal layer is simple, the cost is low, and mass production is easy to achieve.

In some embodiments, the OLED display panel further includes a touch layer 70 disposed on the liquid crystal layer 60 and a cover plate 80 disposed on the touch layer 70.

In some embodiments, the OLED display panel further includes a liquid crystal alignment layer 50 disposed between the first liquid crystal region 601 and the thin-film encapsulation layer 40 so that the liquid crystal molecules positioned in the first liquid crystal region 601 are aligned parallel to the substrate.

Furthermore, the liquid crystal alignment layer includes a polymer material having a photoreactive group, a structure of the polymer material changes through irradiating, and an arrangement direction of the liquid crystal molecules in contact with an upper layer of the polymer material is changed, so that the liquid crystal molecules in the first liquid crystal region are aligned parallel to the substrate. The polymer material having a photoreactive group can be azo compounds.

It should be noted that the above OLED display panel embodiment only describes the above structure. It can be understood that, in addition to the above structure, the OLED display panel provided by the embodiment of the present invention can include any other structure according to requirement, which is not limited thereto.

Another embodiment of the present invention further provides a method of manufacturing an OLED display panel. Specifically, referring to FIG. 2 and FIGS. 3A-3E, the manufacturing method includes steps as follows.

S01, providing a substrate 10 and forming an array functional layer 20 on the substrate.

S02, forming an organic light-emitting layer 30 on the array functional layer 20.

Figure 3A:
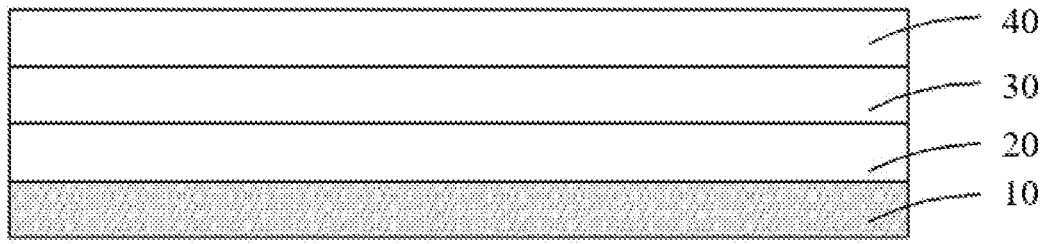
FIGS. 3A-3E are schematic structural flowcharts of the method of manufacturing an OLED display panel provided by an embodiment of the present invention.

S03, forming a thin-film encapsulation layer 40 on the organic light-emitting layer 30, that is, forming a structure shown in FIG. 3A.

S04, forming a liquid crystal alignment layer 50 on the thin-film encapsulation layer 40 corresponding to a non-pixel region.

Figure 3B:
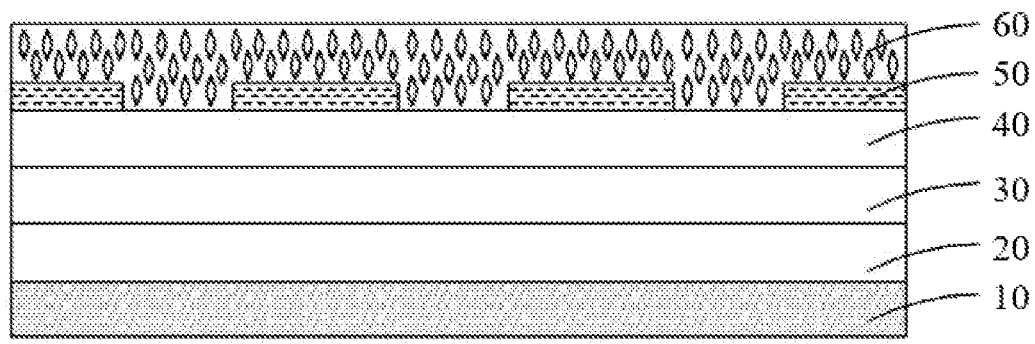

S05, forming a liquid crystal layer 60 on the liquid crystal alignment layer 50 corresponding to the non-pixel region and on a pixel region. Generally, the liquid crystal molecules positioned in the liquid crystal layer are aligned perpendicular to the substrate 10, that is, a structure as shown in FIG. 3B. At this time, the light can be pass through both the non-pixel region and the pixel region.

Figure 3C:
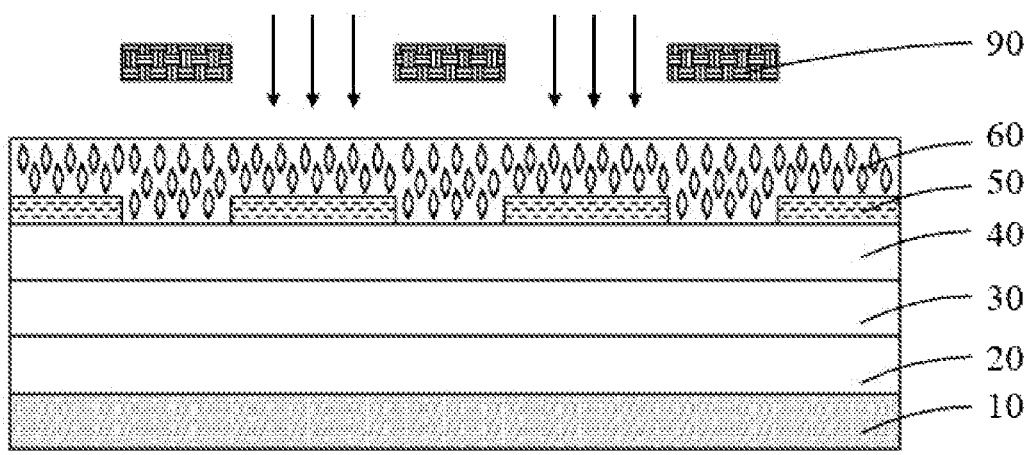
Figure 3D:
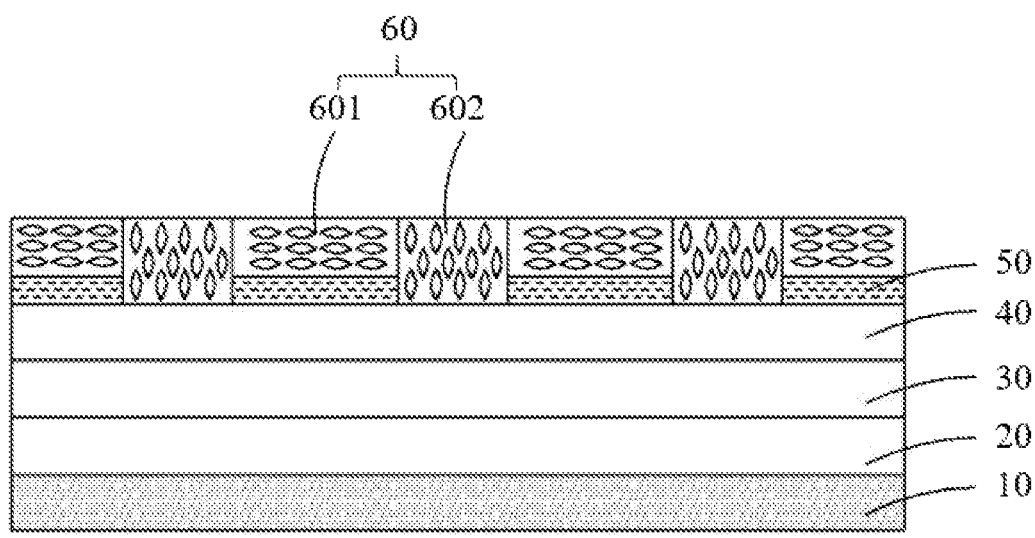

S06, refer to FIG. 3C, providing a mask plate 90 that only shields the pixel region, that is, under cover of the mask plate 90, and irradiating toward the non-pixel region of the liquid crystal layer 60 by ultraviolet light, so that the liquid crystal molecules positioned in the non-pixel region are aligned parallel to the substrate to form a structure shown in FIG. 3D. At this time, the liquid crystal layer is divided into the first liquid crystal region 601 positioned in the non-pixel region and the second liquid crystal region 602 positioned in the pixel region.

Figure 3E:
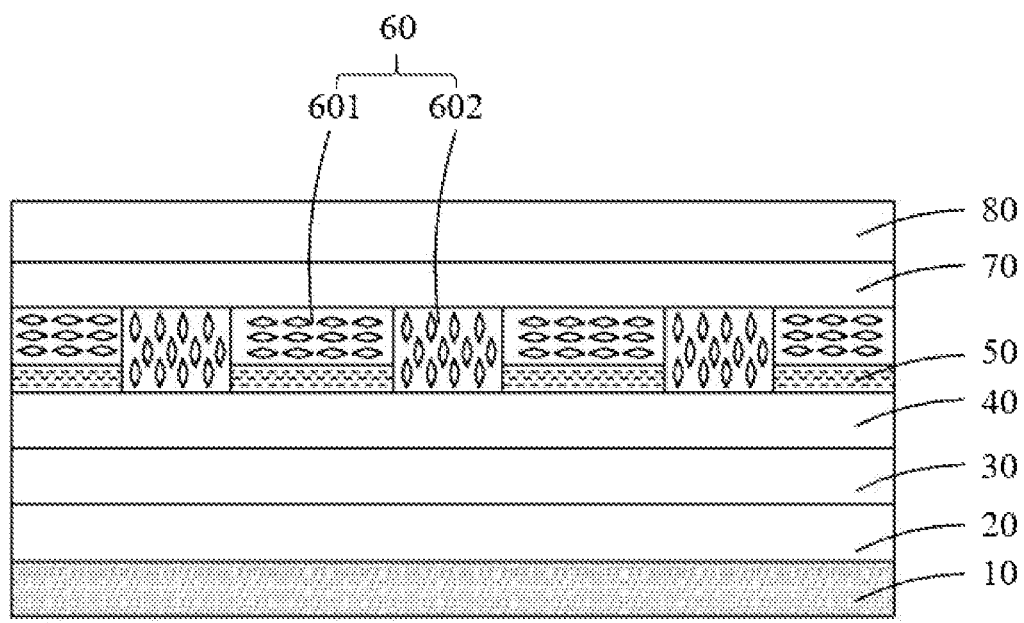

Generally, the touch layer 70 and the cover plate 80 need to be formed on the liquid crystal layer 60 in sequence, that is, a structure shown in FIG. 3E is formed.

In some embodiments, in step S04, a process of forming the liquid crystal alignment layer is an inkjet printing process.

In some embodiments, the liquid crystal alignment layer includes a polymer material having a photoreactive group. Furthermore, the polymer material of the photoreactive group can be azo compounds. Specifically, in step S06, after the non-pixel region of the liquid crystal layer is irradiated with ultraviolet light, the polymer material in the liquid crystal alignment layer undergoes a structural change from a through state to a normal state, thereby making the liquid crystal molecules positioned in the non-pixel region of the liquid crystal layer aligned parallel to the substrate, while the liquid crystal molecules positioned in the pixel region are still aligned perpendicular to the substrate. Wherein, a wavelength of the ultraviolet light can be 365 nm.

Another embodiment of the present invention further provides a display device, including the foregoing display panel, the display device includes, but is not limited to, a mobile phone, a tablet computer, a computer, a television, a car display, a smart watch, and a virtual reality (VR) device, which the present invention is not specifically limited.

In the above embodiments, the description of each embodiment has its own emphasis. For a part that is not detailed in an embodiment, you can refer to the above detailed description for other embodiments, and details are not described here.

The OLED display panel, the manufacturing method thereof, and the display device provided by the embodiments of the present invention have been described in detail above. Specific embodiments have been used in this document to explain the principle and implementation of the present application. The descriptions of the above embodiments are only used to help understand the technical solution of this application and its core ideas. For a person skilled in the art, any modification of equivalent structure or equivalent process made according to the disclosure and drawings of the present invention, or any application thereof, is considered encompassed in the scope of protection defined by the claims of the present invention.

What is claimed is:

1. An organic light-emitting diode (OLED) display panel, comprising:
    a substrate;
    an array functional layer disposed on the substrate;
    an organic light-emitting layer disposed on the array functional layer;

a thin-film encapsulation layer disposed on the organic light-emitting layer;

a liquid crystal layer disposed on the thin-film encapsulation layer and comprising a first liquid crystal region arranged on a non-pixel region and a second liquid crystal region arranged on a pixel region, wherein liquid crystal molecules positioned in the first liquid crystal region are aligned parallel to the substrate; and a liquid crystal alignment layer disposed only in the first liquid crystal region;

wherein the thin-film encapsulation layer adopts a stacked structure of an inorganic layer/organic layer/inorganic layer.

2. The OLED display panel of claim 1, wherein the liquid crystal alignment layer makes the liquid crystal molecules positioned in the first liquid crystal region aligned parallel to the substrate.

3. The OLED display panel of claim 2, wherein the liquid crystal alignment layer comprises a polymer material having a photoreactive group.

4. The OLED display panel of claim 3, wherein the polymer material having the photoreactive group comprises azo compounds.

5. The OLED display panel of claim 1, wherein material of the substrate comprises polyimide.

6. The OLED display panel of claim 5, wherein a thickness of the substrate ranges from 6 microns to 20 microns.

7. The OLED display panel of claim 1, wherein the array functional layer comprises a plurality of low-temperature polysilicon thin film transistors arranged in an array.

8. The OLED display panel of claim 1, wherein the organic light-emitting layer comprises an anode, a light-emitting functional layer, and a cathode.

9. The OLED display panel of claim 8, wherein the anode is a stacked film layer of indium tin oxide/silver/indium tin oxide.

10. The OLED display panel of claim 1, further comprising a touch layer and a cover plate arranged on the liquid crystal layer.

11. The display device, comprising the organic light-emitting diode (OLED) display panel of claim 1.

12. The display device of claim 11, wherein the display device is selected from one of a mobile phone, a tablet computer, a computer, a television, a car display, or a smart watch.

* * * * *